US008890602B2

(12) United States Patent
Sinha et al.

(10) Patent No.: US 8,890,602 B2
(45) Date of Patent: Nov. 18, 2014

(54) WELL-BIASING CIRCUIT FOR INTEGRATED CIRCUIT

(71) Applicants: Samaksh Sinha, Singapore (SG); Manmohan Rana, Ghaziabad (IN); Nishant Singh Thakur, Indore (IN)

(72) Inventors: Samaksh Sinha, Singapore (SG); Manmohan Rana, Ghaziabad (IN); Nishant Singh Thakur, Indore (IN)

(73) Assignee: Freescale Semiconductor, Inc., Austin, TX (US)

( * ) Notice: Subject to any disclaimer, the term of this patent is extended or adjusted under 35 U.S.C. 154(b) by 57 days.

(21) Appl. No.: 13/743,324

(22) Filed: Jan. 16, 2013

(65) Prior Publication Data

US 2014/0197883 A1 Jul. 17, 2014

(51) Int. Cl.
*H03K 3/01* (2006.01)

(52) U.S. Cl.
USPC .......... 327/534; 327/544

(58) Field of Classification Search
USPC .......... 327/534, 544
See application file for complete search history.

(56) References Cited

U.S. PATENT DOCUMENTS

| | | | | |
|---|---|---|---|---|
| 6,833,748 | B2 * | 12/2004 | Cho | 327/374 |
| 6,927,429 | B2 | 8/2005 | Chun et al. | |
| 7,109,782 | B2 | 9/2006 | Kase | |
| 7,170,116 | B2 | 1/2007 | Chun et al. | |
| 7,274,247 | B2 | 9/2007 | Ward et al. | |
| 7,667,484 | B2 * | 2/2010 | Tada | 326/33 |
| 8,164,378 | B2 | 4/2012 | Pietri et al. | |
| 8,299,847 | B2 * | 10/2012 | Matano | 327/544 |
| 2008/0191777 | A1 * | 8/2008 | Lee et al. | 327/333 |
| 2009/0085578 | A1 | 4/2009 | Olofsson | |
| 2012/0133416 | A1 * | 5/2012 | Ogawa | 327/333 |

* cited by examiner

*Primary Examiner* — Quan Tra
(74) *Attorney, Agent, or Firm* — Charles Bergere

(57) ABSTRACT

A well-biasing circuit for an integrated circuit (IC) includes a well-bias regulator for providing well-bias voltages (n-well and p-well bias voltages) to well-bias contacts (n-well and p-well bias contacts) of each cell of the IC when the integrated circuit is in STOP and STANDBY modes. A switch is connected between a core power supply and the well-bias contact for connecting and disconnecting the core power supply and the well-bias contact when the IC is in RUN and STOP modes, and STANDBY mode, respectively. A voltage inverter circuit and a CMOS inverter circuit enable and disable the switch when the IC is in the RUN mode, and STOP and STANDBY modes, respectively.

3 Claims, 4 Drawing Sheets

WELL-BIASING CIRCUIT FOR INTEGRATED CIRCUIT

BACKGROUND OF THE INVENTION

The present invention relates generally to integrated circuits, and more particularly, to a well-biasing circuit for an integrated circuit.

Integrated circuits (ICs) include transistors such as complementary metal-oxide semiconductor (CMOS) transistors that are used to implement logic circuitry. ICs often operate in different power modes including RUN, STANDBY and STOP modes for effective power management. When an IC enters STANDBY or STOP modes (i.e., a low power mode), leakage currents are generated. The leakage currents are a major source of power consumption, especially when the IC includes a large number (in the order of millions) of transistors.

One way of reducing leakage currents is to increase the threshold voltage of the transistors. For CMOS transistors, biasing of the n-well and p-well regions increases the threshold voltage, which reduces the leakage current. Providing a low voltage to the p-well region and a high voltage to the n-well region with respect to a source potential of a CMOS transistor increases the threshold voltage of the CMOS transistor and results in reduced leakage current. When an IC operates in the RUN mode, the n-well region is biased by a core supply voltage of the IC and the p-well region is biased by a ground voltage. To increase the threshold voltage during the STOP and STANDBY modes, the n-well region may be biased with a voltage that is higher than the core supply voltage and the p-well region may be biased with a voltage that is lower than the ground voltage.

Existing ICs use well-biasing circuits to generate and provide different well-bias voltages (to the n-well/p-well regions) during different operating modes of the ICs. The well-biasing circuits include a switch (e.g., a MOS switch) connected between the core power supply/ground and the well-bias contact. When the IC is in the STOP and STANDBY modes, the switch must open completely to disconnect the well-bias contact from the core power supply/ground and reduce the possibility of leakage currents. The gate control voltage of the MOS switch must be maintained greater than or equal to the well-bias voltage to ensure complete opening of the switch. A high-voltage MOS switch is required to maintain the gate control voltage higher than the well-bias voltage. However, this high-voltage MOS switch consumes a lot of power and occupies a large area. Alternatively, a low-voltage MOS switch can be used to keep the gate control voltage equal to the well-bias voltage. However, the gate control voltage of the low-voltage MOS switches used by existing well-biasing circuits fails to track the well-bias voltage. As a result, the low-voltage MOS switch starts conducting leakage current and makes the well-biasing circuit unreliable.

It would be advantageous to have a well-biasing circuit for an IC that reduces the leakage currents in the IC, that is reliable and that overcomes the above-mentioned limitations of existing well-biasing circuits.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements. It is to be understood that the drawings are not to scale and have been simplified for ease of understanding the invention.

DETAILED DESCRIPTION OF THE PRESENT INVENTION

Figure 1A:
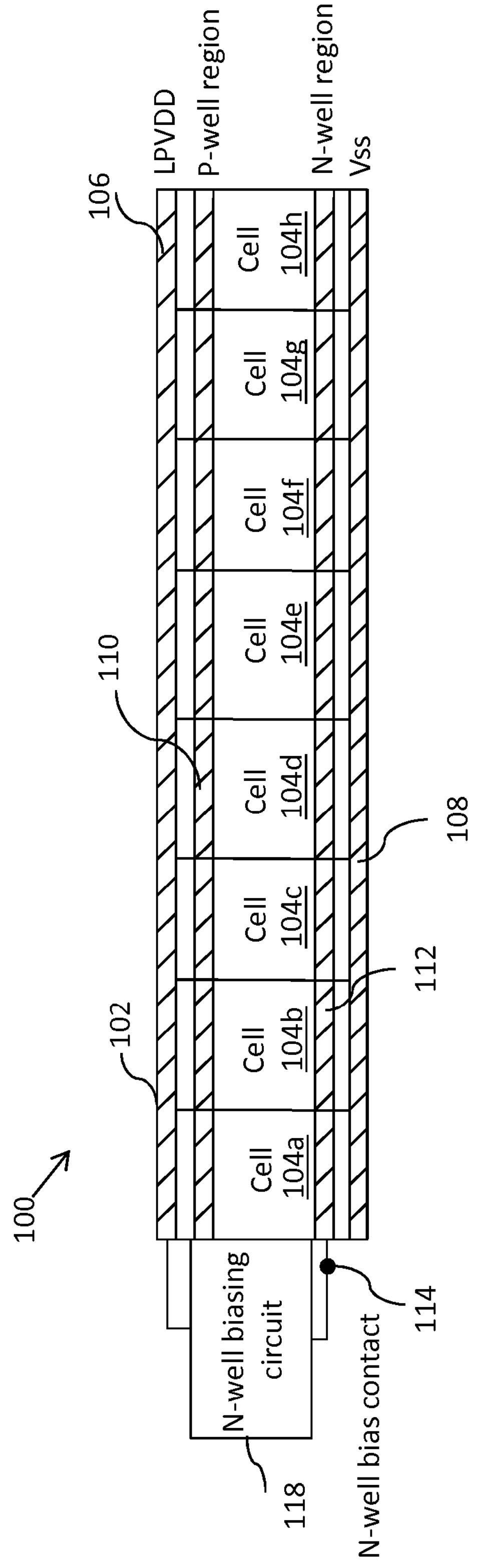
FIGS. 1A and 1B are schematic block diagrams of an integrated circuit.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a well-biasing circuit for an integrated circuit (IC) is provided. The IC includes a plurality of cells that operate on a core power supply, and each cell includes an n-well region and an n-well bias contact to bias the n-well region. The well-biasing circuit is connected to the n-well bias contact of each cell. The well-biasing circuit includes a well-bias regulator that provides a first n-well bias voltage to the n-well bias contact based on a control signal when the IC is in STOP and STANDBY modes. The well-biasing circuit further includes a switch connected between the core power supply and the n-well bias contact. The switch connects the core power supply to the n-well bias contact when the IC is in a RUN mode and disconnects the core power supply from the n-well bias contact when the IC is in the STOP and STANDBY modes. The well-biasing circuit further includes a voltage inverter circuit that has an input terminal for receiving the control signal, a power supply terminal connected to the core power supply, and an output terminal for generating a first intermediate voltage when the IC is in the RUN mode and a second intermediate voltage when the IC is in the STOP and STANDBY modes. The well-biasing circuit further includes a complementary metal-oxide semiconductor (CMOS) inverter that has an input terminal connected to the output terminal of the voltage inverter circuit for receiving the first and second intermediate voltages, a power supply terminal connected to the well-bias regulator, and an output terminal connected to the switch. The CMOS inverter enables and disables the switch when the IC is in the RUN mode, and the STOP and STANDBY modes, respectively.

In another embodiment of the present invention, a well-biasing circuit for an IC is provided. The IC includes a plurality of cells that operate on a core power supply, and each cell includes a p-well region and a p-well bias contact to bias the p-well region. The well-biasing circuit is connected to the p-well bias contact of each cell. The well-biasing circuit includes a well-bias regulator that provides a first p-well bias voltage to the p-well bias contact based on a control signal, when the IC is in STOP and STANDBY modes. The well-biasing circuit includes a switch connected between the p-well bias contact and ground. The switch connects the p-well bias contact to ground when the IC is in a RUN mode and disconnects the p-well bias contact from ground when the IC is in the STOP and STANDBY modes. The well-biasing circuit further includes a CMOS inverter. The CMOS inverter has an input terminal for receiving the control signal, a ground terminal connected to the well-bias regulator, and an output terminal connected to the switch. The CMOS inverter enables and disables the switch when the IC is in the RUN mode, and the STOP and STANDBY modes, respectively.

In yet another embodiment of the present invention, a well-biasing circuit for an IC is provided. The IC includes a plurality of cells that operate on a core power supply, and each cell includes an n-well region and an n-well bias contact to bias the n-well region. The well-biasing circuit is connected to the n-well bias contact of each cell. The well-biasing circuit includes a well-bias regulator that provides a first n-well bias voltage to the n-well bias contact based on a control signal, when the IC is in STOP and STANDBY modes. The well-biasing circuit further includes a switch connected between the core power supply and the n-well bias contact, for connecting the core power supply to the n-well bias contact when the IC is in a RUN mode and disconnecting the core power supply from the n-well bias contact when the IC is in the STOP and STANDBY modes. The well-biasing circuit further includes a voltage inverter circuit. The voltage inverter circuit has an input terminal for receiving the control signal, a power supply terminal connected to the core power supply, and an output terminal for generating a first intermediate voltage when the IC is in the RUN mode and a second intermediate voltage when the IC is in the STOP and STANDBY modes. A level-shifter is connected to the output terminal of the voltage inverter circuit. The level-shifter level shifts the first intermediate voltage to a pre-defined voltage when the integrated circuit is in the RUN mode. A CMOS inverter has an input terminal connected to the level-shifter for receiving the pre-defined voltage when the IC is in the RUN mode and the second intermediate voltage when the IC is in the STOP and STANDBY modes, a power supply terminal for receiving the pre-defined voltage, and an output terminal for generating an output voltage. A resistive-voltage divider is connected between the output terminal of the CMOS inverter and the switch for scaling down the output voltage when the IC is in the STOP and STANDBY modes. The CMOS inverter enables and disables the switch when the integrated circuit is in the RUN mode, and the STOP and STANDBY modes, respectively.

Various embodiments of the present invention provide an IC that includes a well-biasing circuit for biasing a well region of the IC. The IC includes first and second well-biasing circuits of which the first well-biasing circuit provides an n-well bias voltage to an n-well region and the second well-biasing circuit provides a p-well bias voltage to a p-well region of the IC by way of corresponding well-bias contacts, when the IC is in STOP and STANDBY modes. The first and second well-biasing circuits each include a well-bias regulator. The well-bias regulator of the first well-biasing circuit provides the n-well bias voltage that is slightly greater than the first core voltage and the well-bias regulator of the second well-biasing circuit provides the p-well bias voltage that is slightly less than the ground potential. The first well-biasing circuit includes a CMOS inverter and a first switch connected between the core power supply and the n-well bias contact. The first switch is driven by the CMOS inverter. When the IC is in the STOP and STANDBY modes, the output of the CMOS inverter is maintained equal to the n-well bias voltage, which ensures that the gate control voltage of the first switch remains equal to the n-well bias voltage and the first switch is opened completely. Similarly, the second well-biasing circuit includes a CMOS inverter and a second switch connected between the ground terminal and the p-well bias contact. The second switch is driven by the CMOS inverter. When the IC is in the STOP and STANDBY modes, the output of the CMOS inverter is maintained equal to the n-well bias voltage, which ensures that the gate control voltage of the second switch remains equal to the p-well bias voltage and the second switch is opened completely. As both the first and second switches are opened completely, the n-well and p-well bias contacts are completely disconnected from the core power supply and ground terminals, respectively, and leakage currents are significantly reduced. As the gate control voltages of the first and second switches accurately track the n-well and p-well bias voltages respectively, the first and second switches may be implemented using low-voltage MOS switches to reduce power and area requirements. The first and second well-biasing circuits of the present invention can be replicated for each cell of the IC simply by replicating the first/second switch instead of the entire well-biasing circuit, which saves considerable area and routing effort.

Figure 1B:
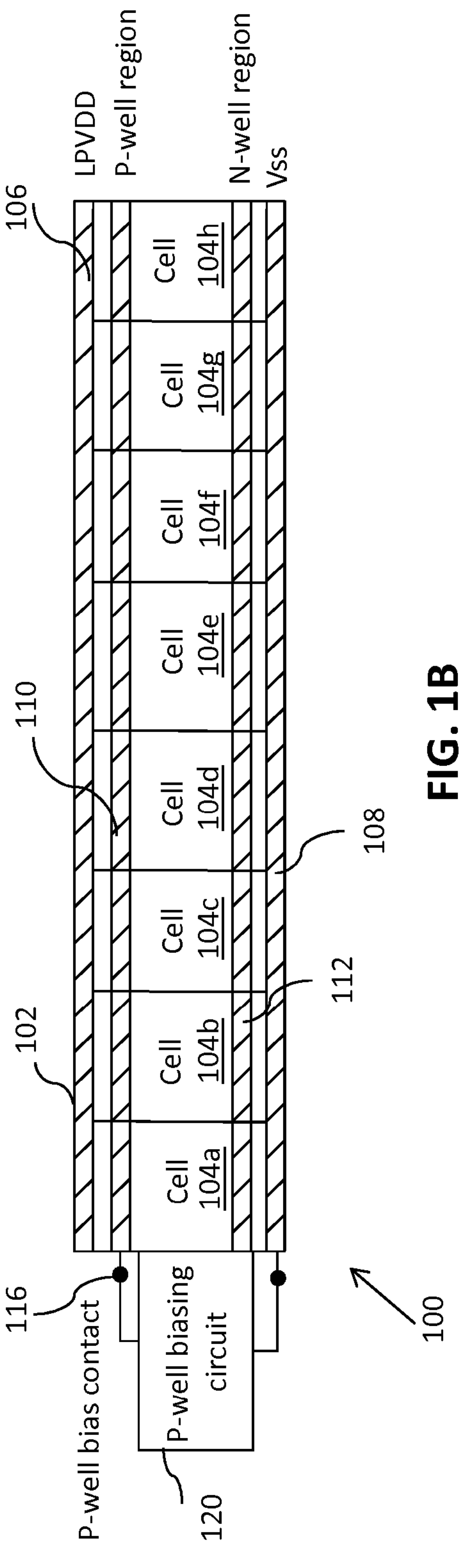

FIGS. 1A and 1B are schematic block diagrams of an integrated circuit (IC) 100. The IC 100 includes a plurality of cells arranged in multiple rows, one of which is shown in FIGS. 1A and 1B (row 102). The row 102 includes a plurality of cells including first through eighth cells 104*a*-104*h* (collectively referred to as cells 104). Each cell 104 includes a plurality of transistors (not shown). Examples of the IC 100 include a microprocessor, a microcontroller (MCU), a system-on-chip (SoC), or an application-specific integrated circuit (ASIC). A core power supply 106 provides a first core voltage LPVDD to the cells 104 and a ground terminal 108 provides a ground voltage Vss to the cells 104.

The IC 100 further includes a p-well region 110 and a n-well region 112. An n-well bias contact 114 is connected to the n-well region 112 and a p-well bias contact 116 is connected to the p-well region 110. The IC 100 includes first and second well-biasing circuits 118 and 120 of which the first well-biasing circuit 118 is connected to the n-well bias contact 114 and the second well-biasing circuit 120 is connected to the p-well bias contact 116. The first and second well-biasing circuits 118 and 120 provide well-bias voltages to the n-well and p-well regions by way of the p-well and n-well bias contacts 116 and 114, respectively. Although only two well-bias contacts (114 and 116) and two well-biasing circuits (118 and 120) are shown, it will be apparent to those skilled in the art that the IC 100 may include multiple well-bias contacts and corresponding well-biasing circuits.

In various embodiments of the present invention, the IC 100 operates in various modes such as a RUN mode in which the IC operates at a first voltage level and one or more low power modes such as STOP and STANDBY modes, where the IC operates at a voltage that is less than the first voltage level. The RUN mode is a high or normal power mode in which the IC 100 functions normally and transistors of the IC 100 (from the p-well and n-well regions 110 and 112, not shown) are switched on. The STOP and STANDBY modes are low power modes in which the transistors are switched off. It will be understood by those of skill in the art that the IC 100 may be able to operate in additional low power modes, such as SLEEP and DEEP SLEEP modes, and that the present invention can be applicable to such additional modes.

Figure 2:
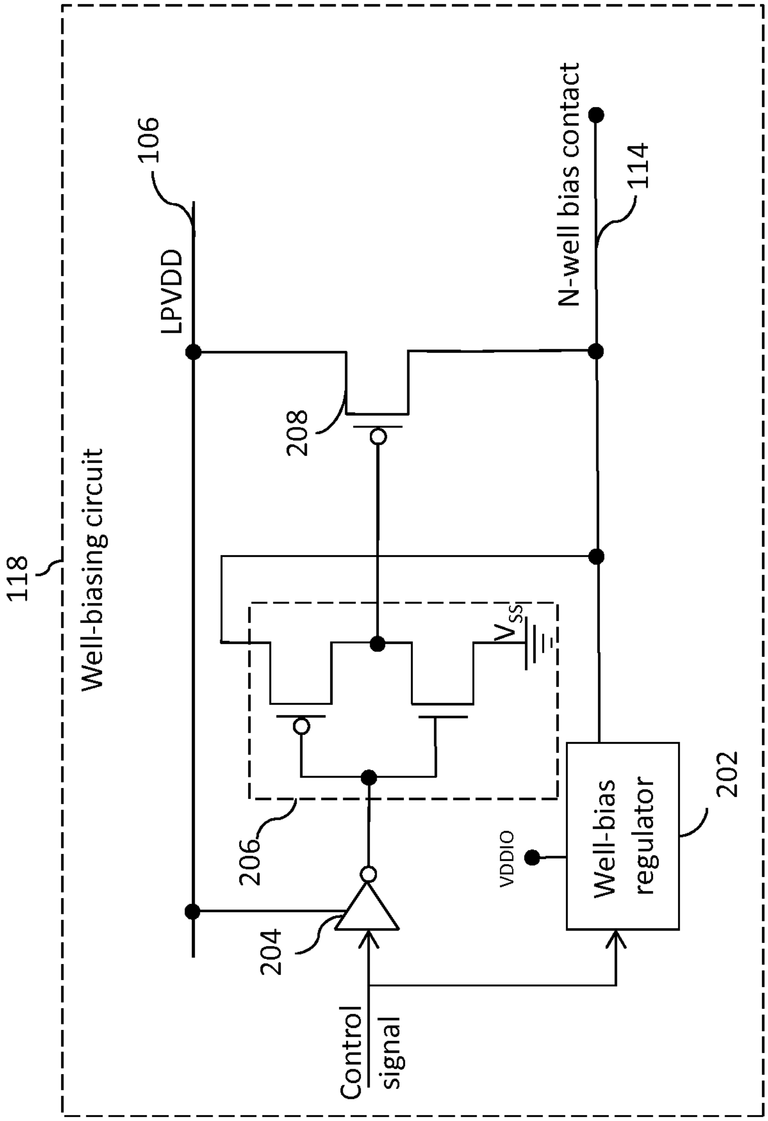
FIG. 2 is a schematic block diagram of a well-biasing circuit for biasing a n-well region of an integrated circuit in accordance with an embodiment of the present invention.

Referring now to FIG. 2, a schematic block diagram of the first well-biasing circuit 118 in accordance with an embodiment of the present invention is shown. The first well-biasing circuit 118 provides a first n-well bias voltage (NWBV) to the n-well bias contact 114 when the IC 100 is in the STOP and STANDBY modes and a second NWBV to the n-well bias contact 114 when the IC 100 is in the RUN mode. The first well-biasing circuit 118 includes a first well-bias regulator 202, a first voltage inverter circuit 204, a first complementary metal oxide semiconductor (CMOS) inverter circuit 206, and a first switch 208.

The first well-bias regulator 202 may be operated using a second core voltage Vddio (generated internally by the IC 100), and is switched off when the IC 100 is in the RUN mode and is switched on to provide the first NWBV to the n-well bias contact 114 when the IC 100 is in the STOP and STANDBY modes. In an embodiment, the first NWBV is greater than the first core voltage LPVDD. The first well-bias regulator 202 is switched on and off based on a control signal generated internally by the IC 100. The control signal is enabled (logic high) to enable the first well-bias regulator 202 when the IC 100 is in the STOP and STANDBY modes and disabled (logic low) to disable the first well-bias regulator 202 when the IC 100 is in the RUN mode.

In various embodiments of the present invention, the first well-bias regulator 202 is designed using a combination of decoders and multiplexers (not shown) for providing a range of first NBWV to the n-well bias contact 114. In an exemplary embodiment, the first core voltage LPVDD is 1.2V, the first NWBV is 1.4V, the second NWBV is 1.2V and the second core voltage Vddio is 3.3V.

The first voltage inverter circuit 204 may be a NOT gate that has an input terminal for receiving the control signal, a power supply terminal connected to the core power supply 106 and an output terminal for generating a first intermediate voltage when the IC 100 is in the RUN mode and a second intermediate voltage when the IC 100 is in the STOP and STANDBY modes, respectively. In various embodiments, the first intermediate voltage is a logic high signal and the second intermediate voltage is a logic low signal.

The first CMOS inverter circuit 206 includes a pair of n-channel and p-channel MOS (NMOS and PMOS) transistors and is well-known in the art. The first CMOS inverter circuit 206 has an input terminal (i.e., a gate terminal) connected to the output terminal of the first voltage inverter circuit 204, a power supply terminal connected to the first well-bias regulator 202, a ground terminal connected to the ground terminal 108 (not shown), and an output terminal connected to the first switch 208. When the IC 100 is in the STOP and STANDBY modes, the power supply terminal of the first CMOS inverter circuit 206 receives the first NWBV.

The first switch 208 may be a low-voltage MOS switch and has an input terminal (i.e., a gate terminal) connected to output terminal of the first CMOS inverter circuit 206, a power supply terminal (i.e. a drain terminal) connected to the core power supply 106, and a source terminal connected to the n-well bias contact 114. The first switch 208 connects the core power supply 106 to the n-well bias contact 114 when the IC 100 is in RUN mode and disconnects the core power supply 106 from the n-well bias contact 114 when the IC 100 is in the STOP and STANDBY modes, i.e., the first CMOS inverter circuit 206 enables and disables the first switch 208 when the IC 100 is in the RUN, and STOP and STANDBY modes, respectively. In an exemplary embodiment of the present invention, the first switch 208 is a p-type MOS (PMOS) switch.

When the IC 100 is in the RUN mode, the first voltage inverter circuit 204 receives the control signal (a logic low signal) and generates the first intermediate voltage (a logic high signal). The gate terminal of the first CMOS inverter circuit 206 receives the logic high signal, which creates a potential difference between the gate and the ground terminals of the first CMOS inverter circuit 206 and a current path is formed between the gate and the ground terminals. The output terminal of the first CMOS inverter circuit 206 generates a voltage equivalent to the ground voltage Vss.

The gate terminal of the first switch 208 receives the ground voltage Vss and the power supply terminal receives the first core voltage LPVDD, which creates a potential difference between the drain and the gate terminals of the first switch 208, and a current path is formed between the drain and source terminals of the first switch 208. Therefore, the first switch 208 conducts in the RUN mode and connects the n-well bias contact 114 to the core power supply 106. The n-well bias contact 114 thus receives the first core voltage LPVDD as the second NBWV which biases the n-well region 112.

When the IC 100 is in the STOP and STANDBY modes, the first voltage inverter circuit 204 receives the control signal (logic high signal) and generates the second intermediate voltage (logic low signal). The gate terminal of the first CMOS inverter circuit 206 receives the logic low signal, which creates a potential difference between the power supply terminal and the gate terminal of the first CMOS inverter circuit 206 and a current path is formed from the power supply terminal to the gate terminal of the first CMOS inverter circuit 206. The output terminal of the first CMOS inverter circuit 206 generates a voltage equivalent to the voltage provided by the power supply terminal, i.e., the first NWBV.

The gate terminal of the first switch 208 receives the first NWBV and the drain terminal receives the first core voltage LPVDD. The first NWBV is greater than the first core voltage LPVDD and creates a current barrier between the drain and gate terminals of the first switch 208. As the gate and source terminals of the first switch 208 are at same voltage (i.e., the first NBWV), no leakage current flows from the gate terminal to the source terminal of the first switch 208 and no current path is formed from the drain terminal to the source terminal of the first switch 208. Therefore, the first switch 208 does not conduct and disconnects the n-well bias contact 114 from the core power supply 106. Thus, the n-well bias contact 114 is completely disconnected from the core power supply 106 when the IC 100 is in STOP and STANDBY modes, which results in reduction of the leakage current.

Figure 3:
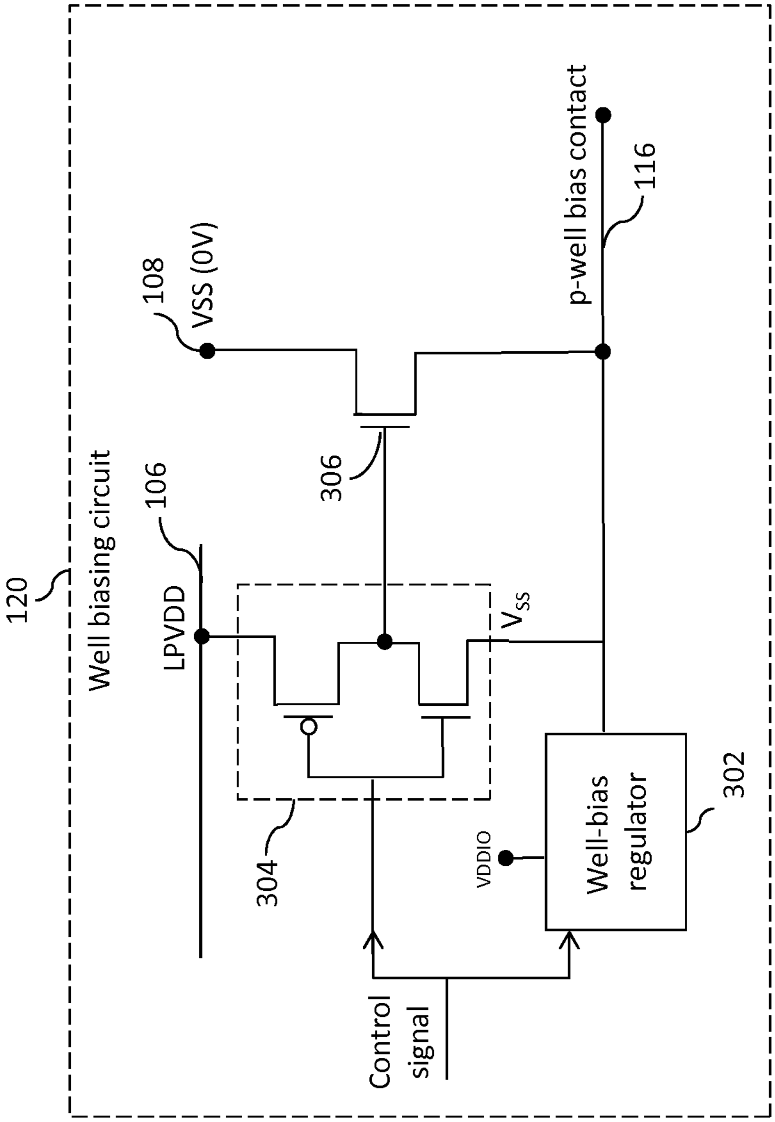
FIG. 3 is a schematic block diagram of a well-biasing circuit for biasing a p-well region of an integrated circuit in accordance with an embodiment of the present invention.

Referring now to FIG. 3, a schematic block diagram of the second well-biasing circuit 120, in accordance with an embodiment of the present invention is shown. The second well-biasing circuit 120 provides a first p-well bias voltage (PWBV) to the p-well bias contact 116 when the IC 100 is in the STOP and STANDBY modes and a second PWBV to the p-well bias contact 116 when the IC 100 is in the RUN mode. The second well-biasing circuit 120 includes a second well-bias regulator 302, a second CMOS inverter circuit 304, and a second switch 306.

The second well-bias regulator 302 may be operated using the second core voltage Vddio and is switched off when the IC 100 is in the RUN mode, and is switched on to provide the first PWBV to the p-well bias contact 116 when the IC 100 is in the STOP and STANDBY modes. In an embodiment, the first PWBV is less than the ground voltage Vss. The second well-bias regulator 302 is switched on and off based on a control signal generated internally by the IC 100. The control signal is enabled (logic high) to enable the second well-bias regulator 302 when the IC 100 is in the STOP and STANDBY modes and disabled (logic low) to disable the second well-bias regulator 302 when the IC 100 is in the RUN mode.

In an exemplary embodiment, the first core voltage LPVDD is 1.2V, the ground voltage is 0V, the first PWBV is −200 mV, the second PWBV is 0V, and the second core voltage Vddio is 3.3V.

The second CMOS inverter circuit 304 has an input terminal that receives the control signal generated based on the operating mode of the IC 100, a ground terminal connected to the second well-bias regulator 302, a power supply terminal connected to the core power supply 106, and an output terminal connected to the second switch 306. When the IC 100 is in the STOP and STANDBY modes, the ground terminal of the second CMOS inverter circuit 304 receives the first PWBV.

The second switch 306 may be a low-voltage MOS switch and has a gate terminal connected to output terminal of the second CMOS inverter circuit 304, a source terminal connected to the ground terminal 108, and a drain terminal connected to the p-well bias contact 116. The second switch 306 connects the p-well bias contact 116 to the ground terminal 108 when the IC 100 is in the RUN mode and disconnects the p-well bias contact 116 from the ground terminal 108 when the IC 100 is in the STOP and STANDBY modes, i.e., the second CMOS inverter circuit 304 enables and disables the second switch 306 when the IC 100 is in the RUN mode, and the STOP and STANDBY modes, respectively. In an exemplary embodiment of the present invention, the second switch 306 is a n-type metal oxide semiconductor (NMOS) switch.

When the IC 100 is in the RUN mode, the gate terminal of the second CMOS inverter circuit 304 receives the logic low signal, which creates a potential difference between the power supply terminal and the gate terminal of the second CMOS inverter circuit 304, and a current path is formed between the supply and the gate terminals. The output terminal of the second CMOS inverter circuit 304 generates a voltage equivalent to the first core voltage LPVDD.

The gate terminal of the second switch 306 receives the first core voltage LPVDD and the source terminal receives the ground voltage Vss, which creates a potential difference between the source and gate terminals of the second switch 306, and a current path is formed between the gate and source terminals of the second switch 306. Therefore, the second switch 306 conducts in the RUN mode and connects the p-well bias contact 116 to the ground terminal 108. The p-well bias contact 116 thus receives the ground voltage Vss as the second PBWV which biases the p-well region 110.

When the IC 100 is in the STOP and STANDBY modes, the gate terminal of the second CMOS inverter circuit 304 receives the logic high signal, which creates a potential difference between the gate terminal and the ground terminal of the second CMOS inverter circuit 304, and a current path is formed from the gate terminal to the ground terminal of the second CMOS inverter circuit 304. The output terminal of the second CMOS inverter circuit 304 generates a voltage equivalent to the voltage provided by the ground terminal, i.e., the first PWBV.

The gate terminal of the second switch 306 receives the first PBWV and the source terminal receives the ground voltage Vss. The first PBWV is less than the ground voltage Vss, and creates a current barrier between the gate and source terminals of the second switch 306. As the gate and drain terminals of the second switch 306 are at same voltage (i.e., the first PBWV), no leakage current flows from the drain terminal to the gate terminal of the second switch 306 and no current path is formed from the drain terminal to source terminal of the second switch 306. Therefore, the second switch 306 does not conduct and disconnects the p-well bias contact 116 from the ground terminal 108. Thus, the p-well bias contact 116 is completely disconnected from the ground terminal 108 when the IC 100 is in STOP and STANDBY modes, which results in reduction of the leakage current.

Figure 4:
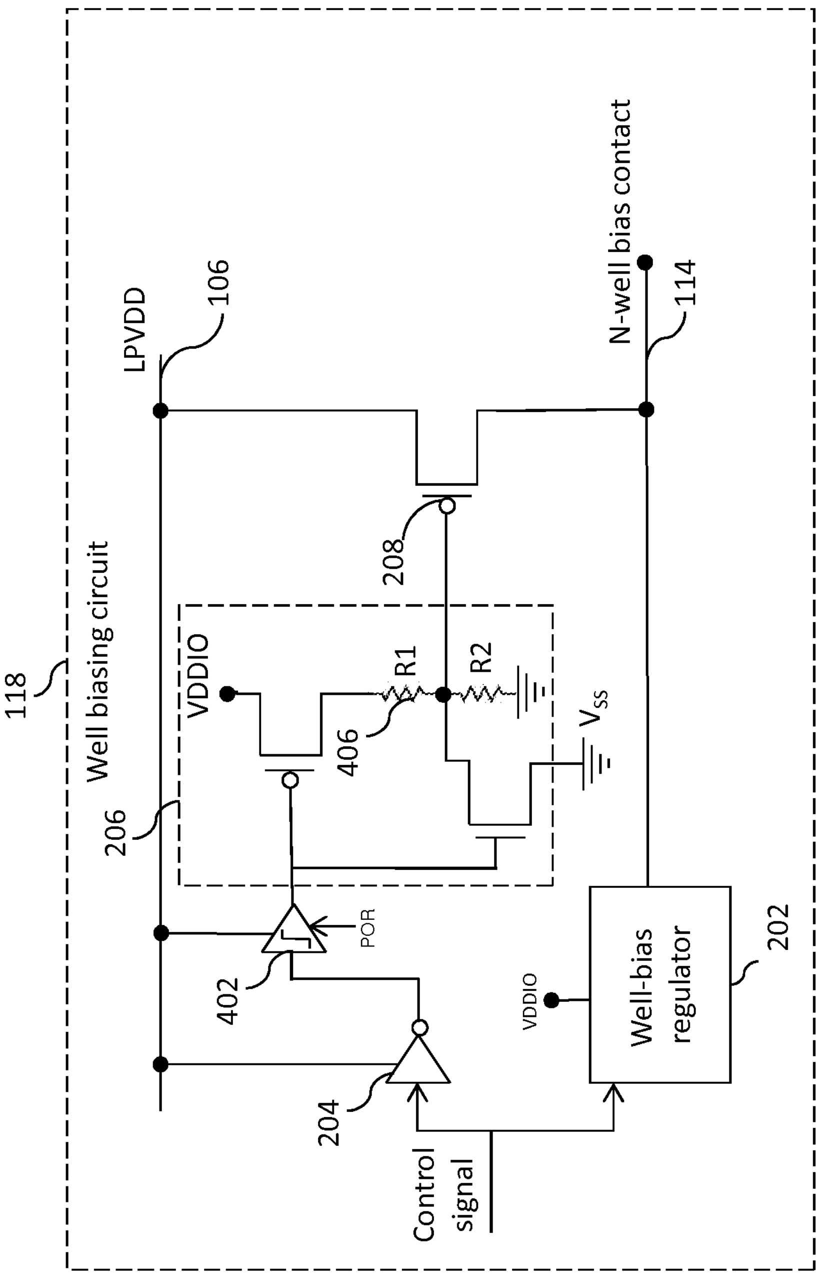
FIG. 4 is a schematic block diagram of a well-biasing circuit for biasing a n-well region of an integrated circuit in accordance with another embodiment of the present invention.

FIG. 4 illustrates an alternate implementation of the first well-biasing circuit 118 in which the first well-biasing circuit 118 additionally includes a level-shifter 402.

The level-shifter 402 has an input terminal that is connected to the output terminal of the first voltage inverter circuit 204, a power supply terminal that is connected to the core power supply 106, and an output terminal that is connected to the first CMOS inverter circuit 206. The level-shifter 402 receives and level shifts the first intermediate voltage to a pre-defined voltage on receiving a power-on-reset (PoR) signal (generated internally by the IC 100), when the IC 100 is in the RUN mode. In one embodiment, the pre-defined voltage is the second core voltage, i.e., Vddio. The level-shifter 402 does not level-shift the second intermediate voltage, and generates a logic low signal when the IC 100 is in the STOP and STANDBY modes.

The first CMOS inverter circuit 206 has a gate terminal that is connected to the output terminal of the level-shifter 402, a power supply terminal that receives the second core voltage Vddio, a ground terminal that is connected to the ground terminal 108, and an output terminal that is connected to the first switch 208. A resistive-voltage divider 406 (including resistors R1 and R2) is connected to the output terminal of the first CMOS inverter circuit 206. The resistor R1 has a first terminal connected to source terminal of the PMOS of the first CMOS inverter circuit 206 and a second terminal connected to the output terminal of the first CMOS inverter circuit 206. The resistor R2 has a first terminal connected to the output terminal of the first CMOS inverter circuit 206 and a second terminal connected to the ground terminal 108. When the IC 100 is in the STOP and STANDBY modes, the values of the first and second resistors are chosen such that the output voltage of the first CMOS inverter circuit 206 is scaled down from the second core voltage Vddio to the first NWBV.

When the IC 100 is in the RUN mode, the first voltage inverter circuit 204 receives the control signal (a logic low signal) and generates the first intermediate voltage signal (a logic high signal). The first voltage inverter circuit 204 operates on the first core voltage LVDD which causes the logic high signal to be approximately equal to LVDD (which is less than the second core voltage Vddio). The level-shifter 402 receives and level shifts the logic high signal to the second core voltage Vddio based on the PoR signal. The input terminal of the first CMOS inverter circuit 206 receives the second core voltage Vddio from the level-shifter 402, and the output terminal of the first CMOS inverter circuit 206 generates a voltage equivalent to the ground voltage Vss.

The gate terminal of the first switch 208 receives the ground voltage Vss and the power supply terminal receives the first core voltage LPVDD, which creates a potential difference between the drain and the gate terminals of the first switch 208, and a current path is formed between the drain and source terminals of the first switch 208. Therefore, the first switch 208 conducts in the RUN mode and connects the n-well bias contact 114 to the core power supply 106. The level-shifter 402 level-shifts the logic high signal to the second core voltage Vddio, by way of which the ground voltage Vss appears at the gate terminal of the first switch 208, thereby enabling the first switch 208, when the IC 100 is in the RUN mode.

When the IC 100 is in the STOP and STANDBY modes, the first voltage inverter circuit 204 receives the control signal (logic high signal) and generates the second intermediate voltage (the logic low signal). The input terminal of the level-shifter 402 receives the logic low signal and the output terminal of the level-shifter 402 generates the logic low signal. The gate terminal of the first CMOS inverter circuit 206 receives the logic low signal and the output terminal generates a voltage equivalent to the second core voltage Vddio.

The gate terminal of the first switch 208 receives the first NWBV from the output terminal of the first CMOS inverter circuit 206, by way of the resistive divider circuit 406. The resistive divider circuit 406 scales down the second core voltage Vddio to the first NWBV, by way of which the first NWBV is obtained at the gate terminal of the first switch 208. As the gate and source terminals of the first switch 208 are at same voltage (i.e., the first NBWV), no leakage current flows from the gate terminal to the source terminal of the first switch 208 and no current path is formed from the drain terminal to the source terminal of the first switch 208. Therefore, the first switch 208 does not conduct and disconnects the n-well bias contact 114 from the core power supply 106. Thus, the n-well bias contact 114 is completely disconnected from the core power supply 106 when the IC 100 is in STOP and STANDBY modes, which results in reduction of the leakage current.

In various embodiments of the present invention, the first and second switches 208 and 306 may be implemented for each cell 104, rather than replicating the first and second well-biasing circuits 118 and 120, which reduces the size of the IC 100.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

The invention claimed is:

1. A well-biasing circuit for an integrated circuit (IC), wherein the IC includes a plurality of cells that operate on a core power supply, and each cell includes an n-well region and an n-well bias contact to bias the n-well region, and wherein the well-biasing circuit is connected to an n-well bias contact of each cell, the well-biasing circuit comprising:

a well-bias regulator for providing a first n-well bias voltage to the n-well bias contact based on a control signal, when the IC is in a low power mode;

a switch, connected between the core power supply and the n-well bias contact, for connecting the core power supply to the n-well bias contact when the IC is in a RUN mode and disconnecting the core power supply from the n-well bias contact when the IC is in the low power mode;

a voltage inverter circuit having an input terminal for receiving the control signal, a power supply terminal connected to the core power supply, and an output terminal for generating first and second intermediate voltages when the IC is in the RUN mode and the low power mode, respectively;

a level-shifter, connected to the output terminal of the voltage inverter circuit, for level shifting the first intermediate voltage to a pre-defined voltage when the IC is in the RUN mode;

a complementary metal-oxide semiconductor (CMOS) inverter circuit having an input terminal connected to the level-shifter for receiving the pre-defined voltage when the IC is in the RUN mode and the second intermediate voltage when the IC is in the low power mode, a power supply terminal for receiving the pre-defined voltage, and an output terminal for generating an output voltage; and a resistive-voltage divider, connected between the output terminal of the CMOS inverter circuit and the switch, for scaling down the output voltage when the IC is in the low power mode, wherein the CMOS inverter circuit enables and disables the switch when the IC is in the RUN and low power modes, respectively.

2. The well-biasing circuit of claim 1, wherein the switch includes a p-type MOS (PMOS) transistor.

3. The well-biasing circuit of claim 1, wherein the n-well bias contact receives a second n-well bias voltage from the core power supply when the IC is in the RUN mode.

* * * * *